United States Patent [19]

Bradbury et al.

[11] Patent Number: 4,522,662

[45] Date of Patent: Jun. 11, 1985

[54] CVD LATERAL EPITAXIAL GROWTH OF SILICON OVER INSULATORS

[75] Inventors: Donald R. Bradbury, Palo Alto; Chi-Wing Tsao, Piedmont; Theodore I. Kamins, Palo Alto, all of Calif.

[73] Assignee: Hewlett-Packard Company, Palo Alto, Calif.

[21] Appl. No.: 522,804

[22] Filed: Aug. 12, 1983

[51] Int. Cl.³ .................... H01L 21/205; H01L 21/76
[52] U.S. Cl. .................... 148/175; 29/576 E; 29/578; 148/174; 148/DIG. 25; 148/DIG. 26; 148/DIG. 50; 156/610; 156/612; 156/613; 156/614; 427/86
[58] Field of Search .............. 148/174, 175; 29/576 E, 29/578; 156/610, 612–614; 427/86

[56] References Cited

U.S. PATENT DOCUMENTS

| 3,511,702 | 5/1970 | Jackson et al. | 148/175 |
| 3,653,991 | 4/1972 | Sirtl et al. | 148/175 |
| 3,661,636 | 5/1972 | Green et al. | 427/86 |
| 3,746,908 | 7/1973 | Engeler | 357/30 X |
| 3,943,622 | 3/1976 | Kim et al. | 29/579 |
| 4,210,470 | 7/1980 | Marinace | 148/33.2 |
| 4,346,513 | 8/1982 | Nishizawa et al. | 29/578 X |

OTHER PUBLICATIONS

Druminski et al, "Selective Etching & Epitaxial Refilling ... SiH₄/HCl/H₂", J. Crystal Growth, 31 (1975) pp. 312–316.
Runyan et al., "Behavior of Large-Scale Surface ... Silicon Epitaxial Growth", J. Electrochem. Soc., vol. 114, No. 11, Nov. 1967, pp. 1154–1158.

Primary Examiner—William G. Saba
Attorney, Agent, or Firm—Jeffery B. Fromm; Cheryl L. Shavers

[57] ABSTRACT

A method for growing Silicon On Insulator (SOI) films using only conventional very large scale integration (VLSI) techniques is provided. By sequentially varying the flow of HCL gas during the vertical-growth, lateral-overgrowth, coalescence, and planarization stages of the epitaxial deposition process allows the formation of high-quality SOI films on wider oxide stripes suitable for general transistor applications.

24 Claims, 5 Drawing Figures

CVD LATERAL EPITAXIAL GROWTH OF SILICON OVER INSULATORS

BACKGROUND OF THE INVENTION

There are many potential applications for single-crystal silicon films grown over insulators (SOI). The potential exists for producing vertically integrated, three-dimensional circuits having greatly increased packing densities and for dielectric isolation of MOS devices for improved performance, as in high-voltage switching devices of MOS circuits in which the p-channel transistor would be placed in the SOI film and completely isolated from the n-channel transistor with trench oxide to eliminate "latch-up" between devices. In response to these goals, different SOI processes, such as laser-beam, electron-beam and strip-heater recrystallization, have been developed. An alternative is the lateral growth of silicon over oxide stripes on a silicon wafer during chemical vapor deposition of the silicon layer.

A similar substrate can be used in all of these processes. This substrate consists of, for example, a <100> silicon wafer covered with silicon dioxide which is then etched by standard photolithographic techniques to form oxide stripes in the <100> direction with silicon seed areas adjacent to the oxide stripes. In the laser-beam, electron-beam, and strip-heater methods a uniform film of polysilicon is deposited over the oxide-striped substrate; then the deposited polysilicon is melted by scanning the surface with a beam or with a hot wire (strip-heater approach). As the molten silicon over the seed area solidifies, its crystal structure continues that of the substrate. Ideally, this same structure also continues into the silicon film over the oxide surface as the silicon solidifies.

SUMMARY OF THE INVENTION

The present invention discloses a technique which permits the lateral growth of silicon over oxide stripes on a substrate during the chemical vapor deposition (CVD) of the overlying silicon layer. This silicon layer is deposited by a slightly modified epitaxial procedure using the pyrolysis of silane with the addition of a reactant gas such as HCl gas to suppress polysilicon nucleation on the oxide stripes. Silicon is grown vertically in the seed area until the upper edge of the oxide is reached, and then is grown laterally and vertically until two adjacent lateral growth fronts coalesce to form a smooth planar surface. Planarity is controlled by using different HCl partial pressures during the vertical growth, lateral growth, coalescence and planarization phases of the process.

The advantages of CVD lateral overgrowth compared to other SOI technologies include the following:
1. The lateral epitaxial film is single crystal and not large-grain polycrystalline silicon.
2. The entire wafer is heated to the deposition temperature, and no temperature gradient exists across the wafer, resulting in low stress films.
3. The process is less complicated than the other SOI approaches, and standard epitaxial processing equipment is used.

DETAILED DESCRIPTION OF THE INVENTION

Figure 1:
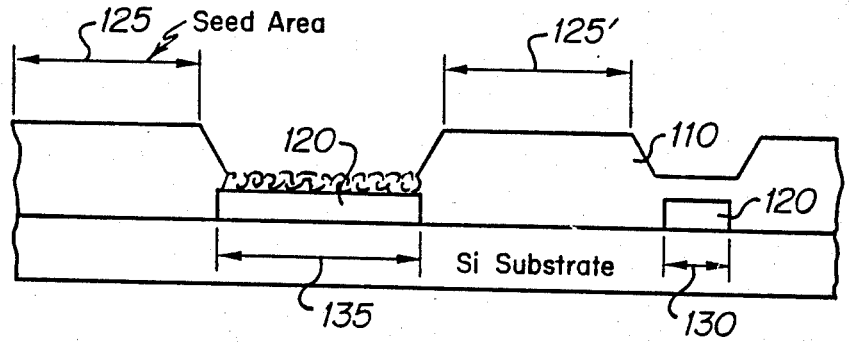
FIG. 1 illustrates a cross section of a partially completed overgrowth of silicon over silicon dioxide stripes of different widths according to a preferred embodiment of the present invention.

In FIG. 1 the lateral overgrowth of a epitaxial layer 110 over a silicon dioxide layer 120 and adjacent seed areas 125 and 125' without the use of a reactant (e.g. HCl) is shown. If the oxide stripe is sufficiently narrow (<5 microns), as shown in region 130, no nucleation occurs on the oxide surface at all during the epitaxial silicon growth. Instead, the silicon species preferentially migrate toward the adjacent seeding regions 125 and 125'. The seed areas compete for silicon atoms that would otherwise form nuclei on the oxide surface. It is believed that lateral diffusion lowers the surface supersaturation level below the critical value for nucleation to occur. Continuing the deposition process results in the lateral growth of the epitaxial film from the seed area over the edge of the oxide stripe until it joins with an adjacent epitaxial deposit. In contrast, nucleation of polysilicon on wide oxide stripe (<5 microns), as shown in region 135, occurs in the center region. Therefore, from this lateral overgrowth only limited widths of lateral epitaxial silicon can be grown over an oxide surface without the use of a reactant gas along with a conventional silicon containing gas. The addition of a hydrohalic reactant (e.g. HCl) during the deposition suppresses nucleation on such wider oxide stripes 135 so that a wide nucleation-free region is obtained, and more extensive lateral expitaxial overgrowth occurs. Thus, the controlled use of a reactant in combination with a silicon containing gas and inert carrier gas (e.g. hydrogen) allows the formation of high-quality SOI films on wider oxide stripes 135 suitable for general transistor applications.

Figure 2:
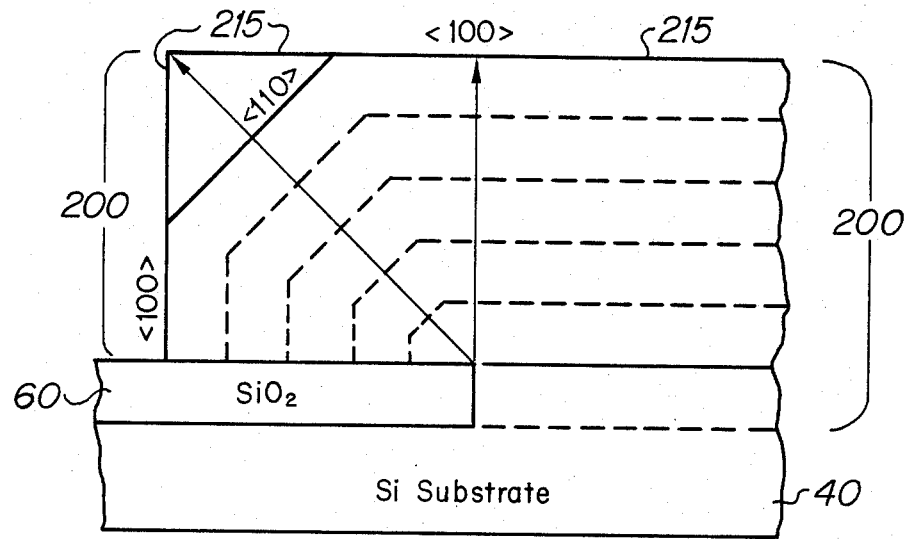
FIG. 2 illustrates a cross section of a partially completed overgrowth of silicon over silicon dioxide layer according to a preferred embodiment of the present invention.
Figure 3:
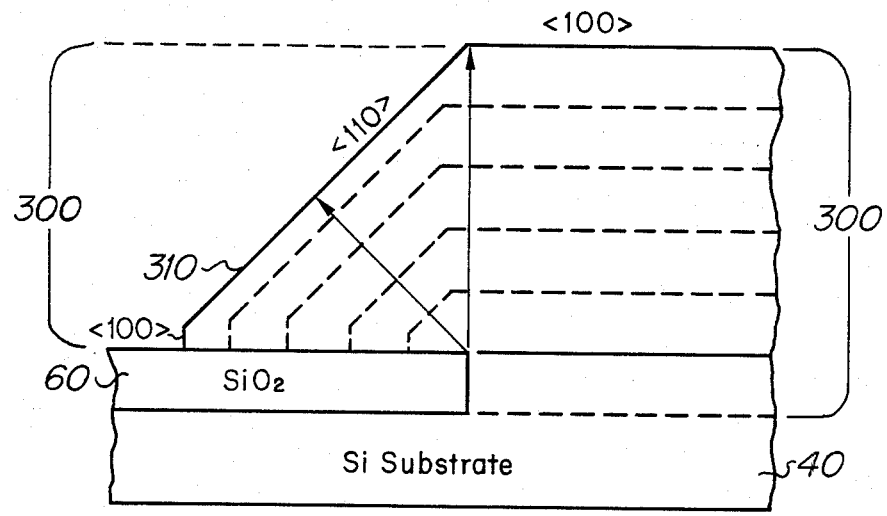
FIG. 3 illustrates a cross section of a partially completed overgrowth of silicon over silicon dioxide layer as in FIG. 2 under different deposition conditions.

In addition to suppression of polysilicon nucleation on SiO$_2$, the use of a reactant gas changes the growth-rate ratio of the <110> planes of silicon with respect to the <100> planes. FIG. 2 shows a cross section of a partially completed overgrowth of epitaxial layer 200 over silicon dioxide layer 60 on Si substrate 40 with a high reactant flow during the lateral overgrowth, while FIG. 3 illustrates the results at a lower reactant flow. The high HCl partial pressure as shown in FIG. 2 increases the growth rate of the <110> planes with respect to that of the <100> planes of the epitaxial layer 200 so that the slow-growing <100> planes remain as the boundary 215 of the epitaxial deposit. Conversely, at low reactant partial pressures as shown in FIG. 3 the <100> planes grow faster, leaving the <110> planes of the epitaxial layer 300 as the bounding planes 310.

Figure 4:
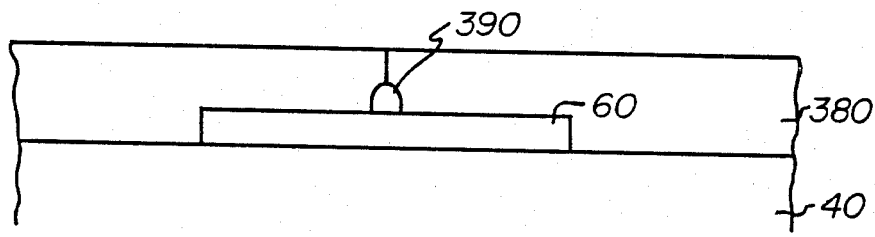
FIG. 4 illustrates the coalescence phase of the epitaxial overgrowth, showing a void where two growth fronts meet, according to the prior art.

If we attempt lateral overgrowth at the high fixed value of, for example, 0.5 liters/min. of reactant gas flow, 100 millimeters of a silicon containing gas and 100 liters/min. of an inert carrier gas, the two lateral growth planes will meet and coalesce at the upper edge of the vertical <100> planes, leaving a void 390, as shown in FIG. 4. The size of the void 390 is reduced by lowering the reactant flow during the lateral overgrowth to reduce the height of the vertical <100> plane. In addition, a minimum HCl flow must be maintained to prevent polysilicon nucleation on the oxide 60. However, as discussed above, when the distance between growth planes is less than 5 microns, lateral diffusion is favored over nucleation, and no reactant is needed. Consequently, the reactant flow may be eliminated during the final coalescence stage of the lateral overgrowth. Using these considerations, we can optimize conditions for lateral overgrowth by sequentially varying the flow rate of HCl gas while holding the silicon containing gas flow rate substantially constant during deposition. In addition, this silicon containing gas flow rate can also be varied during deposition to optimize condition for this lateral overgrowth.

Figure 5:
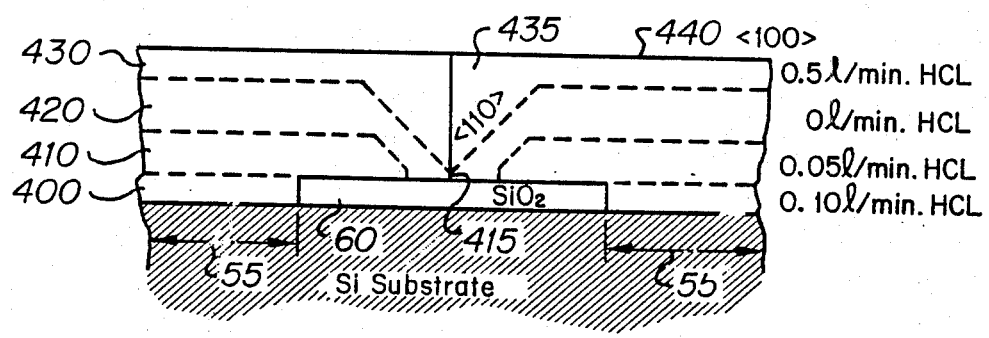
FIG. 5 illustrates a cross section of a completed overgrowth of silicon over a silicon dioxide layer according to a preferred embodiment of the present invention.

For example, a structure consisting of a silicon substrate 50 covered by a 1 micron thick silicon dioxide portion 60, 10 microns wide with adjacent 10 microns wide seed areas 55, is overgrown by the deposition of four layers for lateral overgrowth as illustrated in FIG. 5. Vertical growth of a epitaxial layer 400 using moderate reactant flows, for example, flows in the range of 0.10 liters/min. to 0.3 liters/min. of HCl in combination with a flow of typically 0.1 liters/min., silane are used to suppress polysilicon nucleation on the silicon dioxide 60. Lateral growth of epitaxial layer 410 is then initiated by reducing the reactant flow, for example, flows in the range of 0.05 to 0.2 liters/min., to maximize the growth rate of the laterally propagating <100> planes with respect to that of the <100> planes and to minimize void size 414 while maintaining sufficient reactant flow to prevent polysilicon nucleation on silicon dioxide 60. During the deposition of epitaxial layer 420 no HCl flow is used to prevent void formation during coalescence of lateral growth planes. Deposition of final epitaxial layer 430 requires high HCl flows, for example flows in the range of 0.5 liters/min. to 0.7 liters/min., to maximize the <110> growth rate and minimize vertical <100> growth to fill the remaining groove 435 and produce a planar surface 440.

The result of sequentially controlling the HCl gas flow is the elimination of the interface void 390 and the groove 435, resulting in a smooth planar surface 440 of the silicon over both the seeding region 55 and the oxide stripe 60.

We claim:

1. A method for producing a semiconductor structure comprising the steps of:
   forming a non-nucleating insulating layer over a semiconductor substrate;
   removing a portion of said insulating layer to form an insulating region, said insulating region being surrounded by an exposed surface region of the semiconductor substrate;
   forming a first epitaxial semiconductor layer over said exposed surface region to form an essentially flat surface with said insulating layer, said first semiconductor layer being formed in an environment having a first concentration of reactant; and
   forming a second epitaxial semiconductor layer over said first semiconductor layer and laterally covering a portion of said insulating region substantially without voids therebetween, said second semiconductor layer being formed in an environment having a second concentration of reactant, said second concentration being different than the first concentration of reactant.

2. A method as in claim 1, wherein said first semiconductor layer comprises epitaxial silicon.

3. A method as in claim 1, wherein said reactant comprises hydrogen chloride gas in combination with a silicon containing gas.

4. A method as in claim 1, wherein said second semiconductor layer comprises epitaxial silicon.

5. A method as in claim 1, wherein said reactant comprises hydrogen chloride gas in combination with a silicon containing gas.

6. A method as in claim 1, wherein both of said semiconductor layers comprise epitaxial silicon.

7. A method as in claim 1 further comprising the step of:
   forming a third epitaxial semiconductor layer over said second semiconductor layer and laterally covering remaining portions of said insulating region substantially without voids therebetween, said third semiconductor layer being formed in an environment having a third concentration of reactant, said third concentration of reactant being different than the second concentration.

8. A method as in claim 1, wherein said insulating layer comprises silicon dioxide.

9. A method as in claim 2, wherein said insulating layer comprises silicon dioxide.

10. A method as in claim 3, wherein said first concentration of reactant is obtained by a range of ratio of flows of 0.1–0.3 of hydrogen chloride gas to 0.1 of silicon containing gas, to 100 of an inert carrier gas.

11. A method as in claim 4, wherein said insulating layer comprises silicon dioxide.

12. A method as in claim 5, wherein said second concentration of reactant is obtained by a range of ratio of flows of 0.05–0.2 of hydrogen chloride gas to 0.1 of silicon containing gas to 100 of an inert carrier gas.

13. A method as in claim 6, wherein said insulating layer comprises silicon dioxide.

14. A method as in claim 6 wherein said first concentration of reactant is obtained by a range of ratio of flows of 0.1 to 0.3 of hydrogen chloride gas to 0.1 of silicon containing gas to 100 of an inert carrier gas.

15. A method as in claim 14, wherein said second concentration of reactant is obtained by a range of ratio of flows of 0.05–0.2 of hydrogen chloride gas to 0.1 of silicon containing gas to 100 of an inert carrier gas.

16. A method as in claim 7, wherein said reactant comprises hydrogen chloride gas in combination with a silicon containing gas.

17. A method as in claim 7 further comprising the step of:
   forming a fourth epitaxial semiconductor layer over said third semiconductor layer to form an essentially flat surface substantially parallel to the surface of said semiconductor substrate, said fourth semiconductor layer being formed in an environment having a fourth concentration of reactant, said fourth concentration of reactant being different than the third concentration.

18. A method as in claim 7, wherein said third semiconductor layer comprises epitaxial silicon.

19. A method as in claim 18, wherein said insulating layer comprises silicon dioxide.

20. A method as in claim 16, wherein said third concentration of reactant is obtained with substantially zero flow of HCl and by a ratio of 0.1 of silicon containing gas to 100 of an inert carrier gas.

21. A method as in claim 17, wherein said fourth semiconductor layer comprises epitaxial silicon.

22. A method as in claim 21, wherein said insulating layer comprises silicon dioxide.

23. A method as in claim 17, wherein said reactant comprises hydrogen chloride gas in combination with a silicon containing gas.

24. A method as in claim 23, wherein said fourth concentration of reactant is obtained by a range of ratio of flows of 0.3–0.7 of hydrogen chloride gas to 0.1 of silicon containing gas to 100 of an inert carrier gas.

* * * * *

UNITED STATES PATENT AND TRADEMARK OFFICE
CERTIFICATE OF CORRECTION

PATENT NO. : 4,522,662
DATED : June 11, 1985
INVENTOR(S) : Donald R. Bradbury, Chi-Wing Tsao, Theodore I. Kamins It is certified that error appears in the above—identified patent and that said Letters Patent is hereby corrected as shown below:

Column 1, line 13 delete "of MOS" and insert "or CMOS"

Column 2, line 35 delete "stripe ($<$ 5" and insert "stripes ($>$ 5--

Column 2, line 58 delete "The" and insert "A--

Column 3, line 37 delete "414" and insert "415--

Signed and Sealed this

Fifth Day of November 1985

[SEAL]

Attest:

DONALD J. QUIGG

Attesting Officer

Commissioner of Patents and Trademarks